(12) United States Patent
Disselnkoetter et al.

(10) Patent No.: US 11,029,342 B2
(45) Date of Patent: Jun. 8, 2021

(54) DEVICE FOR MEASURING ELECTRIC CURRENT

(71) Applicant: ABB Schweiz AG, Baden (CH)

(72) Inventors: Rolf Disselnkoetter, Mauer (DE); Roberto Ottoboni, Zovo (IT); Sergio Toscani, Casalpusterlengo (IT)

(73) Assignee: ABB SCHWEIZ AG, Baden (CH)

( * ) Notice: Subject to any disclaimer, the term of this patent is extended or adjusted under 35 U.S.C. 154(b) by 89 days.

(21) Appl. No.: 16/360,038

(22) Filed: Mar. 21, 2019

(65) Prior Publication Data

US 2019/0293688 A1 Sep. 26, 2019

(30) Foreign Application Priority Data

Mar. 22, 2018 (EP) .................................... 18163223
Jun. 8, 2018 (EP) .................................... 18176757
Jun. 22, 2018 (EP) .................................... 18179296

(51) Int. Cl.
*G01R 15/20* (2006.01)
*G01R 15/18* (2006.01)

(52) U.S. Cl.
CPC ........... *G01R 15/20* (2013.01); *G01R 15/202* (2013.01); *G01R 15/205* (2013.01); *G01R 15/207* (2013.01); *G01R 15/18* (2013.01)

(58) Field of Classification Search
CPC .... G01R 15/20; G01R 15/207; G01R 15/202; G01R 15/205; G01R 15/18; G01R 19/00; G01R 1/18; G01R 15/14; G01R 15/146

USPC ..................................................... 324/117 H
See application file for complete search history.

(56) References Cited

U.S. PATENT DOCUMENTS

| | | | | |
|---|---|---|---|---|
| 7,164,263 B2* | 1/2007 | Yakymyshyn | ....... | G01R 15/207 324/117 H |
| 2011/0080177 A1* | 4/2011 | Beck | ...................... | G01R 15/18 324/509 |
| 2011/0121827 A1* | 5/2011 | Yakymyshyn | ....... | G01R 15/207 324/251 |
| 2015/0142376 A1* | 5/2015 | Ausserlechner | ....... | G01D 5/145 702/151 |
| 2017/0184635 A1* | 6/2017 | Ugge | .................... | G01R 15/207 |

* cited by examiner

*Primary Examiner* — Christopher P McAndrew
(74) *Attorney, Agent, or Firm* — Leydig, Voit & Mayer, Ltd.

(57) ABSTRACT

A device for measuring electric current includes: a plurality of magnetic field sensor elements positioned along one or more continuous closed paths encircling a current carrying conductor, each sensor element being sensitive to one vector component of a magnetic field generated by the electric current, vector directions of sensitivity for each sensor element being oriented to be tangential with the closed path at each sensor location, each sensor element generating an output signal, the output signal of each sensor element being amplified by an element-specific gain factor, the amplified output signals of the sensor elements being electronically combined to form a measurement signal representing a value proportional to the current flowing in the current carrying conductor. At least one sensor element on a closed path has a sensitivity which is different from sensitivities of other sensor elements on a same path.

15 Claims, 3 Drawing Sheets

US 11,029,342 B2

DEVICE FOR MEASURING ELECTRIC CURRENT

CROSS-REFERENCE TO PRIOR APPLICATIONS

Priority is claimed to European Patent Application No. 18163223.3, filed on Mar. 22, 2018, European Patent Application No. EP 18176757.5, filed on Jun. 8, 2018, and European Patent Application No. EP 18179296.1, filed on Jun. 22, 2018, the entire disclosures of which are hereby incorporated by reference herein.

FIELD

The invention is about a device for measuring electric current, which comprises a plurality of magnetic field sensor elements positioned along one or more continuous closed paths encircling a current carrying conductor, where each sensor element is sensitive to one vector component of the magnetic field generated by the electric current, where the vector direction of sensitivity for each sensor element is oriented to be tangential with the closed path at each sensor location, where each sensor element generates an output signal, where the output signal of each sensor element is amplified by an element-specific gain factor, where the amplified output signals of the sensor elements are electronically combined to form the measurement signal representing a value proportional to the current flowing in the current carrying conductor.

BACKGROUND

The invention thus relates to galvanically isolated current sensors that are based on configurations (arrays) of several magnetic field sensor elements that are grouped around the current carrying conductor. Their output signals are electronically combined to form the measurement output signal of the current sensor.

Known current sensors that are based on magnetic cores, like current transformers or open or closed loop Hall-effect transducers, are characterized by a large volume, weight and cost due to the relatively large involved masses of the magnetic iron core and the secondary copper-wire winding. Further, conventional current transformers are not able to measure pure DC-currents.

U.S. Pat. No. 7,164,263 B2 shows a configuration of equidistant magnetic field sensor elements on closed paths around the conductor, which have equal sensitivities and are aligned in two groups either parallel or antiparallel to the path direction. Their output signals are added with different polarities in the sensor electronics, thus ensuring that the current sensor has a low offset.

In the "conventional" sensors the magnetic core is used for performing the line integration of the magnetic field on a closed loop around the conductor, which will be a good representation of the enclosed current. However, this can be also achieved to some extent by using an array of small linear magnetic field sensor elements that are located on a closed path (e.g. on a circle) around the conductor and have their sensitive axes aligned along this path, if their output-signals are electronically added together to form the output signal of the actual current sensor. In this way the magnetic core material and the secondary winding can be avoided, which results in a sensor of much lower weight for the same dimensions.

A disadvantage of the sensor arrays is however, that both due to the discrete positions of the elements and to the individual deviations of their positions, orientations and sensitivities the line integration of the magnetic field around the conductor will be always imperfect. This will result in some sensitivity also to close-by currents that pass the loop on its outside. This can especially lead to magnetic crosstalk in multi-phase arrangements or in other cases where there are nearby currents, for example eddy currents that are generated in the walls of a metallic cabinet.

SUMMARY

In an embodiment, the present invention provides a device for measuring electric current, comprising: a plurality of magnetic field sensor elements positioned along one or more continuous closed paths encircling a current carrying conductor, each sensor element being sensitive to one vector component of a magnetic field generated by the electric current, vector directions of sensitivity for each sensor element being oriented to be tangential with the closed path at each sensor location, each sensor element being configured to generate an output signal, the output signal of each sensor element being amplified by an element-specific gain factor, the amplified output signals of the sensor elements being electronically combined to form a measurement signal representing a value proportional to the current flowing in the current carrying conductor, wherein at least one sensor element on a closed path has a sensitivity which is different from sensitivities of other sensor elements on a same path, or wherein the output signal of at least one sensor element on a closed path is amplified with a different gain factor than other sensor elements on a same path before the sensor signals are combined to form the measurement signal, and/or wherein the sensor elements are unequally spaced along a length of each closed path so that the current measuring device has a reduced crosstalk sensitivity with respect to certain current paths.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
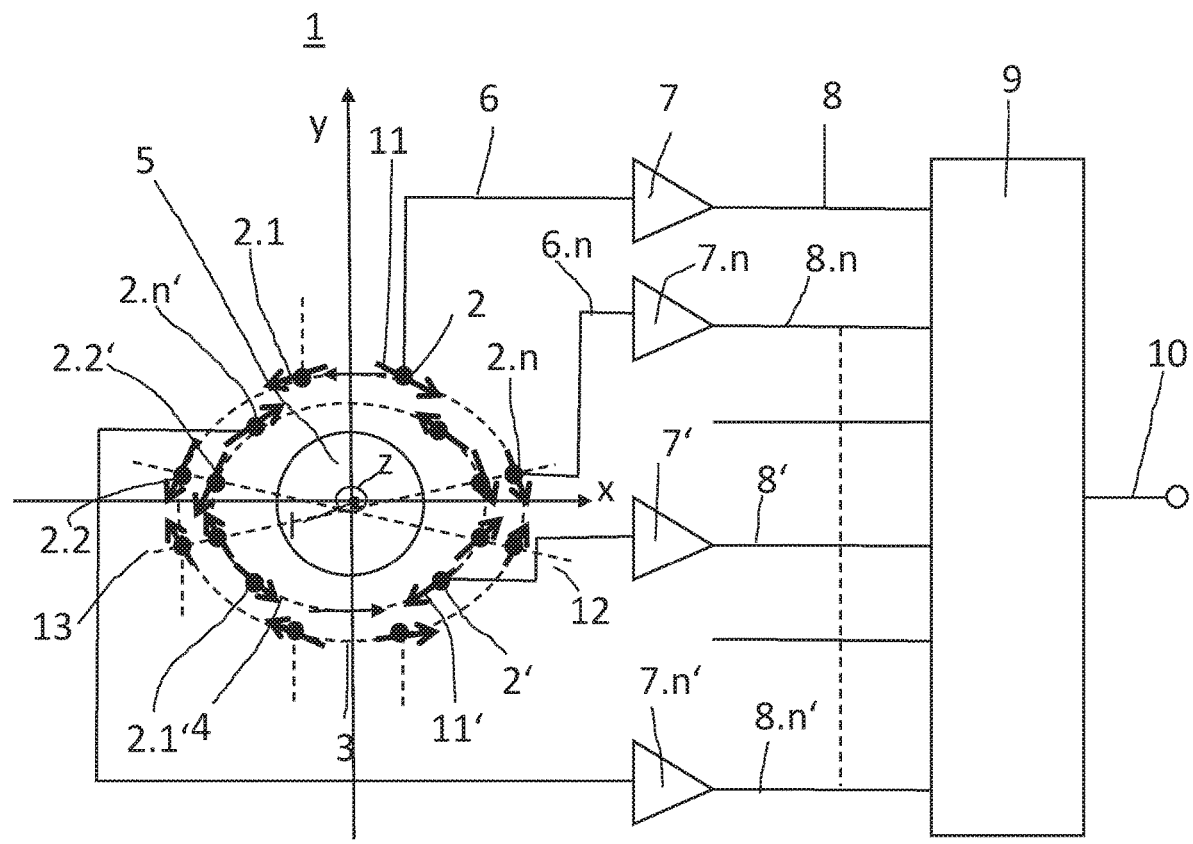
FIG. 1 shows a device for measuring electric current according to a first embodiment of the invention.

In an embodiment, the present invention provides a device for measuring electric current with a minimized magnetic crosstalk from external currents.

According to the invention, at least one sensor element on a closed path has a sensitivity which is different from the sensitivities of the other sensor elements on the same path, or the output signal of at least one sensor element on a closed path is amplified with a different gain factor than that of the other sensor elements on the same path before the sensor signals are combined to form the measurement signal, and/or the sensor elements are unequally spaced along the length of each closed path. Such a device for measuring electric current has a much reduced crosstalk sensitivity with respect to certain current paths. In the measurement device according to the invention magnetic crosstalk from external currents can be minimized by the specific design of the sensor element arrays and the specific configurations of sensor elements in such sensor element arrays.

The current sensor according to the invention is composed of several magnetic field sensor elements that are arranged on one or more closed paths around the current carrying conductor and have their sensitive axes aligned along these paths. The output signals of the elements are electronically combined to form the output signal of the actual current sensor.

However, in contrast to sensor designs known in the prior art, either the positions of the individual sensor elements are selected such that they deviate from a uniform, i.e. equidistant distribution on the respective path, or their sensitivities or the gain factors with which their output signals are added together are chosen different from one another.

In further designs both types of modifications may apply at the same time. In an advantageous embodiment, at least one sensor element on a closed path has a sensitivity which is different from the sensitivities of the other sensor elements on the same path, or the output signal of at least one sensor element on a closed path is amplified with a different gain factor than that of the other sensor elements on the same path before the sensor signals are combined to form the measurement signal, and the sensor elements are unequally spaced along the length of each closed path.

These modifications according to the invention are designed such, that the crosstalk-sensitivity of the current sensor will be especially reduced with respect to currents in certain conductors or groups of conductors, e.g. with respect to the other phase conductors in a multiphase arrangement.

In a two-dimensional arrangement of long parallel conductors, e.g. a straight multiphase busbar system in a switchgear, where the sensor elements of the arrays would be arranged in a plane perpendicular to the conductors, the crosstalk sensitivity can be designed to be especially low in one or more specific directions, e.g. along the intersection line between the plane of the array and the plane of the conductors in a planar system. This would again result in reduced crosstalk from the other phase currents.

By an appropriate selection of the gains and the angular positions of the sensor elements the current sensors can be further specifically designed to achieve low crosstalk sensitivity in extended ranges around the target orientation and position/distance of the entire sensor by assuring that the crosstalk amplitude is close to zero and has either a minimum or a horizontal inflection point close to its target orientation. This is also advantageous as real conductors have finite cross section and the current distributions may vary as a function of the frequency due to eddy current and proximity effects.

Aa advantage of the solution according to this invention is that by applying the conceptions of the invention it is possible to design current sensors which combine the advantages of sensors with complete magnetic field integration, i.e. low magnetic crosstalk, with those of sensor arrays, i.e. low volume and weight. Further, the crosstalk-amplitude will remain at a low level even if the current sensor is slightly misaligned with respect to conductors which carry interfering currents.

The current sensor according to the invention is composed of a multitude of magnetic field sensor elements that are arranged on one or more closed paths around the conductor carrying the current I to be measured.

According to an advantageous embodiment, the field sensor elements may be based on Hall effect, magnetoresistive effects or on inductive principles.

According to another advantageous embodiment, the sensitive directions of the uniaxial elements may be oriented in parallel or anti-parallel to the local path direction and individual elements on the same path may have different sensitivities or their output signals are amplified by different gain factors before they are combined to form the sensor signal.

According to an advantageous embodiment, the individual elements are non-evenly distributed along the paths. In an advantageous embodiment, the sensor element configuration has a higher element concentration in the vicinity of a certain sensor axis. Such a sensor axis is for example the x-axis or the y-axis of a Cartesian coordinate system, in which the x- and the y-axes define the plane in which the closed paths of the sensor elements are positioned, and the current carrying conductor interceps this plane, and at the point of interception the direction of the conductor defines the z-axis of the coordinate system.

The output signals of the individual sensor elements are electronically combined to generate the output signal of the current sensor.

The measurement device operated as a current sensor according to the invention has a much reduced crosstalk sensitivity with respect to certain current paths.

According to an advantageous embodiment of the invention, the sensor elements have both different sensitivity (gain factor) and are non-evenly distributed along the path(s). For example, according to an advantageous embodiment, the sensor elements have a higher element concentration, in the vicinity of a certain sensor axis, which means a lower distance of the elements from this sensor axis.

According to a preferred embodiment, the paths on which the sensor elements are arranged are preferably mostly parallel to the field of the magnetic current to be measured. This means the path circulation direction is close to the main magnetic field direction.

In an advantageous embodiment, the paths have circular, elliptic or nearly rectangular shape.

In an advantageous embodiment, configuration of the sensor elements (positions, sensitivities and gain factors) is mirror symmetrical with respect to its X-axis.

In an advantageous embodiment, configuration of the sensor elements (positions, sensitivities and gain factors) is mirror symmetrical with respect to its Y-axis.

An advantage of the device according to the invention is that crosstalk is especially reduced with respect to certain current paths (e.g. in 2-dimen-sional configurations with respect to conductors at a certain angular position with respect to the sensor array)

Particularly, crosstalk sensitivity is reduced in extended ranges around the target orientation, possibly also the position/distance, of the entire sensor by assuring that the crosstalk amplitude is close to zero and has either a minimum or a horizontal inflection point close to its target orientation.

Appropriate parameters, such as individual gains and angular positions of the sensor elements, for achieving this goal can be either determined based on trial and error or by means of optimization calculations, e.g. by minimizing a suited cost function of the crosstalk and its derivatives as a function of the deviations from the regular array configuration (with equal gains and equidistant elements) for suited boundary conditions.

Different paths contain elements with different sensitivities (e.g., different types of sensors).

In an advantageous embodiment, sensor elements on outer paths have lower sensitivity than elements on inner paths For maximizing the dynamic range of the sensor the output of the inner and the outer elements are combined in such a way, that at low currents the sensor output signal is mostly determined by the signals of the inner elements, while above a certain current amplitude a switchover to the outer elements will take place. By this a large SNR and a linear sensor characteristic will be always maintained. The switchover may be abrupt or gradual, when the current amplitude is increased In another advantageous embodiment, placement of the sensor elements on the different paths around the current carrying conductor is made in such a way that linear arrays are formed in the radial directions which are composed of an even number of elements and which are symmetrical with respect to the axis of the conductor assuming that the latter has a symmetrical cross section In this case, the selection of the gain factors and polarities allocated to the different elements of the linear arrays is done such that in the current range in which all of the elements will deliver a sufficiently large and linear output signal the effect of the low order magnetic field components in the space-coordinates will be reduced in the output signal of the current sensor. This also results in a reduction of magnetic crosstalk from remote sources of the magnetic field Measures are taken for the individual calibration of the sensitivity and the offset of the elements in order to reduce the influences of sensor tolerances on the crosstalk sensitivity of the current sensor According to an advantageous embodiment the sensor has an even number of elements of each type.

According to an advantageous embodiment one half of the elements of each type has their sensitive axes oriented in parallel, the other half anti-parallel to the path circulation, while only the output signals of the second half are inverted before they are combined to form the output of the current sensor. In this way the similar offsets of the elements of the same type, which may further be temperature dependent, will be essentially eliminated or at least reduced by a pair- or group-wise subtraction of the elements' output signals.

The outputs of the individual elements are combined according to their respective polarities before the output signals of the groups are combined to form that of the current sensor.

According to an advantageous embodiment, the current sensor includes other measures for the electronic compensation of the sensitivity- and offset-drift of the elements, e.g. by using electronic circuits with temperature dependent resistors or by performing compensation based on temperature measurements with other sensors.

Calibration of the sensitivities of the individual elements, generation of the output signal of the current sensor, compensation of offset and the temperature drifts of offset and sensitivity, application of weight factors and formation of the output signal are performed by analog trimming devices and analog electronic circuitry, which may be based on adders and amplifiers that use operational amplifiers Calibration of the sensitivities of the individual elements, generation of the output signal of the current sensor, compensation of offset and the temperature drifts of offset and sensitivity, application of weight factors and formation of the output signal are performed by a simultaneous A/D-conversion of the output signals of the individual elements and by the application of suited digitally stored offset- and gain corrections, weight factors, temperature corrections and summations in the digital domain by means of a calculation unit, for example a microcontroller or similar, which forms the corrected output signal of the current sensor.

In multi-conductor applications, the current in a conductor may be measured by combining the outputs of the sensor arrays belonging to different conductors in order to decouple the effects of the different currents and to improve crosstalk rejection and measurement accuracy.

According to an advantageous embodiment the sensor is mounted such that its axis/direction of reduced crosstalk-sensitivity is pointing into the direction of the source(s) of magnetic interference fields, e.g. by an alignment of the sensor axes (X, Y, Z) with those (X', Y', Z') of a three-phase conductor system (where X' is in the direction of the shortest connection between the straight conductors that extend in the Z'-direction)

FIG. 1 shows a device 1 for measuring electric current I in a current carrying conductor 5. The device 1 comprises a plurality of magnetic field sensor elements. The magnetic field sensor elements are represented by dots. In the exemplary embodiment of FIG. 1 there are shown 16 such field sensor elements. For reason of clearness only 8 of them are specified with reference numerals 2, 2.1, 2.2, . . . , 2.n; 2', 2.1', 2.2', . . . , 2.n'. These are positioned along two continuous closed paths 3, 4 encircling the current carrying conductor 5. One of the paths, path 4, is positioned closer to the current carrying conductor 5 than the other path 3, which is positioned more remotely from the conductor 5. Eight of the field sensor elements are positioned on the inner path 4, and eight of the field sensor elements are positioned on the outer path 3.

The magnetic field sensor elements can be based on any known magnetic sensor principle, for example on Hall effect or magnetoresistive effects or inductive principles.

Each sensor element 2, 2.1, 2.2, . . . , 2.n; 2', 2.1', 2.2', . . . , 2.n' is sensitive to one vector component of the magnetic field generated by the electric current I flowing in the conductor 5. The vector direction of sensitivity for each sensor element 2, 2.1, 2.2, . . . , 2.n; 2', 2.1', 2.2', . . . , 2.n' is indicated by an arrow and is oriented to be tangential with the closed path 3, 4 at each sensor location. For reason of clearness only two of the arrows are specified with a reference numeral, and these are the arrows 11 for sensor element 2 and 11' for sensor element 2'. Arrow 11 points in anti-clockwise direction, whereas arrow 11' points in clockwise direction. This illustrates that sensor elements can differ in type and/or sensitivity, particularly compared to the sensor elements positioned on the other paths. Particularly, the sensitive directions of the magnetic field sensor elements may be parallel or anti-parallel to the local path direction of the paths 3, 4.

In the exemplary embodiment show here, one half of the sensor elements of each type has their sensitive axes oriented in parallel, the other half anti-parallel to the direction of the magnetic field generated by the current carrying conductor 5.

Each sensor element generates an output signal. Exemplary only four output signal lines 6, 6.n, 6', 6n' are shown in the figure, whereby it is understood that each sensor element is connected to an output signal line, even if not shown here in the figure. The output signal of each sensor element is amplified by an amplifier with an element-specific gain factor. Here in the exemplary embodiment each output signal line 6, 6.*n*, 6', 6.*n'* is associated with its own amplifier 7, 7.*n*, 7', 7.*n'*. The amplified output signals of the sensor elements are electronically combined to form the measurement signal 10 representing a value proportional to the current I flowing in the current carrying conductor 5. Electronic combination is achieved by means of an electronic circuitry 9 which has as input the signal lines carrying the amplified output signals, and has as output a signal line carrying the measurement signal 10. For reasons of clearness, only four of the output signal lines 8, 8.*n*, 8', 8.*n'* are specified with reference numerals, and only six such output signal lines are shown in the figure, whereas it is understood that there is for each of the sensor elements an output signal line representing its output, even if not all of them are shown in the figure.

In the exemplary example shown here, the output signals of the anti-parallel oriented sensor elements may be inverted before the output signals of the sensor elements are combined to form the measurement signal 10.

At least one sensor element, for example the sensor element 2 on the outer path 3 has a sensitivity which is different to the sensitivities of the other sensor elements on the same path 3. The output signal 6 of at least one sensor element 2, for example on the outer path 3, is amplified with a different gain factor than the other sensor elements on the same path 3 before the sensor signals are combined to form the measurement signal 10. This is to say, the magnetic field sensor elements may have different gains or sensitivities. Different gains are needed to achieve a direction-sensitive crosstalk-reduction, which is a desirable advantage of the device according to the invention.

In addition, at least one sensor element can have a different sensitive direction. The difference in sensitive direction can be used to compensate offset.

In addition, or as an alternative, as can be seen in the figure, magnetic field sensor elements can be unequally spaced along the length of each closed path 3, 4.

The advantageous effect of a sensor element arrangement as shown and described in the figure is that the current measuring device 1 can be designed to have a much reduced crosstalk sensitivity with respect to certain current paths.

Figure 2:
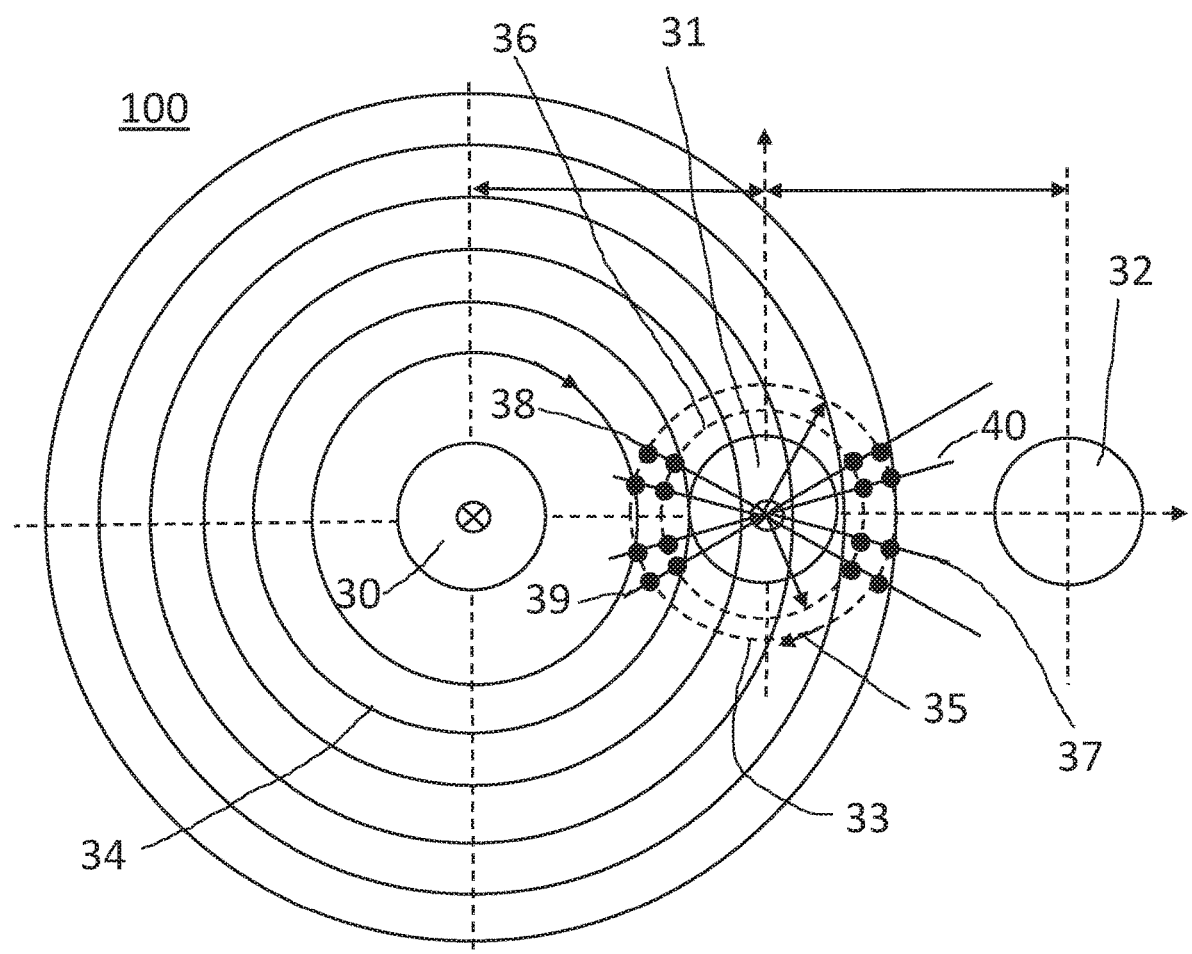
FIG. 2 shows a sensor array according to the invention in a linear 3-phase conductor configuration.

It can be seen in FIG. 1 that the sensor elements and the two paths 3, 4 are arranged in a first plane, wherein close to the point of intersection of the conductor 5 with this plane the direction of the conductor 5 is perpendicular to the drawing plane. The first plane is defined through a first and a second axis x, y of a Cartesian coordinate system with the vector showing in the direction of the conductor 5 at the point of intersection defining the third axis, the z-axis. In FIG. 2 it can also be seen that in the first plane there is a higher sensor element concentration in the vicinity of the x-axis as compared to the y-axis. In addition, in the exemplary embodiment shown in FIG. 1 the configuration of the sensor elements is mirror symmetrical with respect to the x-axis or to the y-axis.

The placement of the sensor elements on the different paths around the current carrying conductor is made in such a way that linear arrays or groups of sensor elements are formed in directions extending radially from the conductor. In the exemplary embodiment shown in FIG. 1 one can see two such arrays, specified by reference numerals 12, 13. Said arrays 12, 13 are composed of an even number of elements, in the exemplary embodiment shown here there are four sensor elements in each array, and they are positioned symmetrically with respect to the axis z of the conductor 5.

In the exemplary example shown here, the sensor elements 2', 2.1', 2.2', . . . , 2.*n'* which are positioned on the inner path 4, which is closer to the current carrying conductor 5, have a higher sensitivity compared to the sensor elements (2, 2.1, 2.2, . . . , 2.*n*) positioned on the outer path 3 positioned more remotely from the conductor 5.

The combination of the sensor output signals in the electronic circuitry 9 may in the exemplary example shown here be configured in such a way that at currents flowing through the conductor with an amplitude below a predeterminable threshold the measurement output signal 10 is mostly determined by the signals of the sensor elements 2', 2.1', 2.2', . . . , 2.*n'* positioned on the inner path 4, while at currents flowing through the conductor 5 with an amplitude above a predeterminable threshold the measurement output signal 10 is mostly determined by the signals of the sensor elements (2, 2.1, 2.2, . . . , 2.*n*) positioned on the outer path 3.

Figure 3:
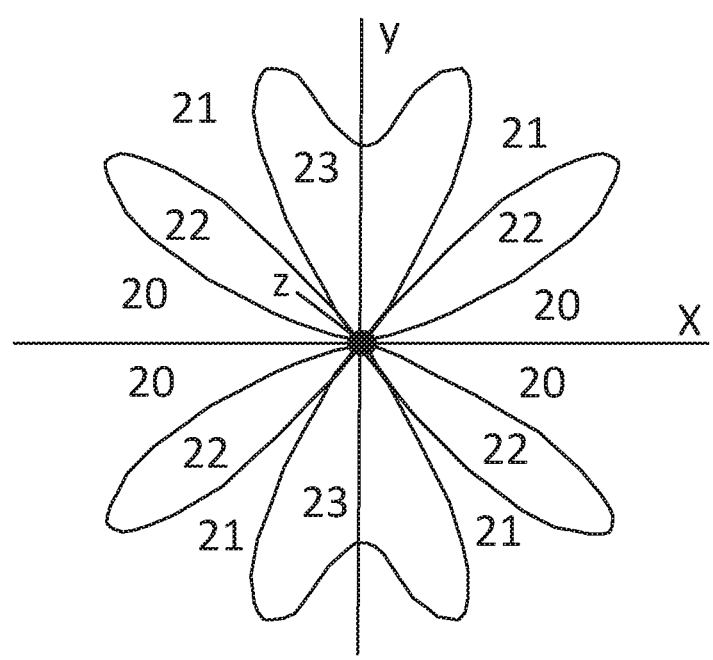
FIG. 3 shows a polar plot of the crosstalk sensitivity of a circular array for a perpendicular line current.

FIG. 3 shows a polar plot of the crosstalk sensitivity of a circular array of sensor elements around a conductor 5 in a measuring device similar to the one shown and explained in FIG. 1. It has non-equidistant elements with different gains. Crosstalk sensitivity is shown for a perpendicular line current, along the z-direction, at a fixed distance from the center of the array. It can be seen that for an appropriate selection of the sensitivities or gains and the sensor positions the crosstalk sensitivity is very low in a certain angular rang 20 around the x-axis, and is high in other angular ranges 22, 23. The invention allows to design a measuring device with sensor elements positioned purposefully such that specific angular ranges of low crosstalk sensitivity can be achieved.

FIG. 2 shows a device 100 for measuring electric current in a multi-conductor configuration comprising three current carrying conductors 30, 31, 32. Each of the conductors 30, 31, 32 can be provided with a device for measuring electric current as shown and explained in FIG. 1. Of course, also only one conductor, such as in the exemplary embodiment shown in FIG. 2 the conductor 31, can be provided with arrays of magnetic field sensor elements as described in FIG. 1. The current in a conductor is then measured by combining the signal outputs of the sensor element arrays related to different conductors in order to decouple the effects of the different currents and to improve crosstalk rejection and measurement accuracy.

FIG. 2 shows a linear 3-phase conductor configuration with conductors 30, 31, 32 and further both the magnetic field 33 of the current I in conductor 31, which shall be measured, and the interfering field lines 34 of the current in the closely located conductor 30 that may generate crosstalk in the sensor output signal. In this example the 16 sensor elements, indicated by dots are arranged in two circles 35, 36 that coincide with the field lines generated by the current I in the center conductor 31. The sensor elements are positioned such that they also form 4 linear arrays 37, 38, 39, 40 with 4 elements in each array.

By modifying the positions or gains (sensitivities) of some of the sensor elements in a controlled way it is possible to achieve low magnetic crosstalk with a flat response to small angular deviations in selected directions with respect to the center of the array. This is at the cost of higher crosstalk in other directions for which it has to be assured that there are no high currents nearby.

The given examples are not exhaustive and there are more possibilities to reduce the crosstalk in certain directions by changing the angular positions and sensitivities of the elements in an array. Solutions can be also found if the conductors are not straight or are aligned in other directions.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

| | |
|---|---|
| 1 | Device for measuring electric current |
| 2; 2.1; 2.2; 2.n | Magnetic field sensor element |
| 2'; 2.1'; 2.2'; 2.n' | Magnetic field sensor element |
| 3 | Continuous closed path |
| 4 | Continuous closed path |
| 5 | Current carrying conductor |
| 6; 6.n; 6'; 6n' | Output signal |
| 7; 7.n; 7'; 7n' | Amplifier with element-specific gain function |
| 8; 8.n; 8'; 8n' | Amplified output signal |
| 9 | Electronic circuitry |
| 10 | Measurement signal |
| 11, 11' | Arrow indicating vector direction of sensor element sensitivity |
| 12 | Linear array of sensor elements |
| 13 | Linear array of sensor elements |
| 20 | Angular range with low crosstalk sensitivity |
| 21 | Angular range with low crosstalk sensitivity |
| 22 | Angular range with high crosstalk sensitivity |
| 23 | Angular range with high crosstalk sensitivity |
| 30 | Conductor |
| 31 | Conductor |
| 32 | Conductor |
| 33 | Magnetic field of conductor 31 |
| 34 | Interfering magnetic field lines of conductor 30 |
| 35 | Outer circular path on which sensor elements are aligned |
| 36 | Inner circular path on which sensor elements are aligned |
| 37 | Array of sensor elements |
| 38 | Array of sensor elements |
| 39 | Array of sensor elements |
| 40 | Array of sensor elements |

What is claimed is:

1. A device for measuring electric current, comprising: a plurality of magnetic field sensor elements positioned along one or more continuous closed paths encircling a current carrying conductor, each sensor element being sensitive to one vector component of a magnetic field generated by the electric current, vector directions of sensitivity for each sensor element being oriented to be tangential with the closed path at each sensor location, each sensor element being configured to generate an output signal, the output signal of each sensor element being amplified by an element-specific gain factor, the amplified output signals of the sensor elements being electronically combined to form a measurement signal representing a value proportional to the current flowing in the current carrying conductor, wherein at least one sensor element on a closed path has a sensitivity which is different from sensitivities of other sensor elements on a same path, or wherein the output signal of at least one sensor element on a closed path is amplified with a different gain factor than other sensor elements on a same path before the sensor signals are combined to form the measurement signal, and/or wherein the sensor elements are unequally spaced along a length of each closed path so that the current measuring device has a reduced crosstalk sensitivity with respect to certain current paths, wherein there are more than one continuous closed paths on which magnetic field sensor elements are positioned, wherein at least one of the paths, an inner path, is positioned closer to the current carrying conductor than a second path, an outer path, positioned more remotely from the conductor, and wherein the output of the sensor elements on the inner and outer path are combined in such that at currents flowing through the conductor with an amplitude below a predeterminable threshold the measurement output signal is mostly determined by the signals of the sensor elements positioned on the inner path, while at currents flowing through the conductor with an amplitude above the predeterminable threshold the measurement output signal is mostly determined by the signals of the sensor elements positioned on the outer path.

2. The device according to claim 1, wherein at least one sensor element on a closed path has a sensitivity which is different to the sensitivities of the other sensor elements on a same path, or wherein the output signal of at least one sensor element on a closed path is amplified with a different gain factor than the other sensor elements on the same path before the sensor signals re combined to form the measurement signal, and wherein the sensor elements are unequally spaced along the length of each closed path.

3. The device according to claim 1, wherein the sensor elements and the one or more continuous closed paths are arranged in a first plane, wherein in a region close to a point of intersection of the current carrying conductor with the first plane a direction of the conductor is perpendicular to the first plane.

4. The device according to claim 3, wherein the first plane is defined through a first and a second axis of a Cartesian coordinate system with a vector showing in the direction of the conductor at a point of intersection defining a third axis, and wherein in the first plane there is a higher sensor element concentration in a vicinity of one of the first or second axis as compared to an other of the first or second axis.

5. The device according to claim 3, wherein the first plane is defined through a first and a second axis of a Cartesian coordinate system with a vector showing in a direction of the conductor at a point of intersection defining a third axis, and wherein the configuration of the sensor elements in terms of positions, and/or sensitivities and/or gain factors is mirror symmetrical with respect to the first axis or to the second axis.

6. The device according to claim 1, wherein the closed path on which the sensor elements are positioned is oriented substantially parallel to the direction of the magnetic field generated by the current carrying conductor.

7. The device according to claim 1, wherein there are more than one continuous closed paths on which magnetic field sensor elements are positioned, and wherein each path contains sensor elements which are different in type and/or sensitivity compared to the sensor elements positioned on the other paths.

8. The device according to claim 1, wherein one half of the sensor elements of each type has their sensitive axes oriented in parallel, the other half anti-parallel to the direction of the magnetic field generated by the current carrying conductor, while the output signals of the anti-parallel oriented sensor elements are inverted before the output signals of the sensor elements are combined to form the measurement signal.

9. The device according to claim 7, wherein at least one of the paths is positioned closer to the current carrying conductor than a second path positioned more remotely from the conductor, and wherein the sensor elements which are positioned on the path which is closer to the current carrying conductor have a higher sensitivity compared to the sensor elements positioned on the path positioned more remotely from the conductor.

10. The device according to claim 3, wherein there are more than one continuous closed paths on which magnetic field sensor elements are positioned, wherein placement of the sensor elements on the different paths around the current carrying conductor is configured such that linear arrays are formed in directions extending radially from the conductor, the arrays comprising an even number of elements and which are positioned symmetrically with respect to the axis of the conductor.

11. The device according to claim 1, wherein the sensor elements are based on Hall effect or magnetoresistive effects or inductive principles.

12. The device according to claim 1, wherein either of a calibration of the sensitivities of the sensor elements, a generation of the measurement output signal, a compensation of offset and temperature drifts of offset and sensitivity, an application of weight factors, and a formation of the measurement output signal are performed by a simultaneous A/D-conversion of the output signals of the sensor elements and by an application of suited digitally stored offset- and gain corrections, weight factors, temperature corrections, and summations in a digital domain by a calculation unit, which forms a corrected measurement output signal of the device.

13. The device according to claim 1, wherein a placement of the sensor elements on the different paths around the current carrying conductor is made such that linear arrays or groups of sensor elements are formed in directions extending radially from the conductor.

14. A device for measuring electric current in a multi-conductor configuration, comprising:

more than one current carrying conductor, wherein each conductor is provided with the device according to claim 1, wherein the current in a conductor is measured by combining signal outputs of sensor element arrays related to different conductors in order to decouple effects of the different currents and to improve crosstalk rejection and measurement accuracy.

15. A device for measuring electric current, comprising:

a plurality of magnetic field sensor elements positioned along one or more continuous closed paths encircling a current carrying conductor, each sensor element being sensitive to one vector component of a magnetic field generated by the electric current, vector directions of sensitivity for each sensor element being oriented to be tangential with the closed path at each sensor location, each sensor element being configured to generate an output signal, the output signal of each sensor element being amplified by an element-specific gain factor, the amplified output signals of the sensor elements being electronically combined to form a measurement signal representing a value proportional to the current flowing in the current carrying conductor, wherein at least one sensor element on a closed path has a sensitivity which is different from sensitivities of other sensor elements on a same path, or wherein the output signal of at least one sensor element on a closed path is amplified with a different gain factor than other sensor elements on a same path before the sensor signals are combined to form the measurement signal, and/or wherein the sensor elements are unequally spaced along a length of each closed path so that the current measuring device has a reduced crosstalk sensitivity with respect to certain current paths, and wherein either of a calibration of the sensitivities of the sensor elements, a generation of the measurement output signal, a compensation of offset and temperature drifts of offset and sensitivity, an application of weight factors, and a formation of the measurement output signal are performed by a simultaneous A/D-conversion of the output signals of the sensor elements and by an application of suited digitally stored offset- and gain corrections, weight factors, temperature corrections, and summations in a digital domain by a calculation unit, which forms a corrected measurement output signal of the device.

* * * * *